(12) United States Patent
Yang

(10) Patent No.: US 8,288,801 B2
(45) Date of Patent: Oct. 16, 2012

(54) SEMICONDUCTOR DEVICE AND METHOD FOR FORMING THE SAME

(75) Inventor: Hee Jung Yang, Suwon (KR)

(73) Assignee: Hynix Semiconductor Inc., Icheon-Si (KR)

( * ) Notice: Subject to any disclaimer, the term of this patent is extended or adjusted under 35 U.S.C. 154(b) by 109 days.

(21) Appl. No.: 12/833,943

(22) Filed: Jul. 9, 2010

(65) Prior Publication Data

US 2011/0127587 A1 Jun. 2, 2011

(30) Foreign Application Priority Data

Nov. 27, 2009 (KR) .......................... 10-2009-0115591

(51) Int. Cl.
 *H01L 29/808* (2006.01)
 *H01L 21/337* (2006.01)
(52) U.S. Cl. ..................................................... 257/263
(58) Field of Classification Search .................. 257/263, 257/E21.447, E29.313, 330, 332, 923, E21.345, 257/E21.629, E29.027, E29.146, E29.262, 257/320, 328, 329, 270, 271, 341, 331; 438/270, 438/272, 589
See application file for complete search history.

(56) References Cited

U.S. PATENT DOCUMENTS

| | | | |
|---|---|---|---|
| 6,040,212 A | 3/2000 | Kim | |
| 6,316,806 B1 * | 11/2001 | Mo | 257/330 |
| 6,818,946 B1 * | 11/2004 | Venkatraman | 257/330 |
| 2008/0050877 A1 * | 2/2008 | de Fresart et al. | 438/270 |
| 2008/0073706 A1 | 3/2008 | Hayashi | |
| 2008/0197407 A1 * | 8/2008 | Challa et al. | 257/330 |
| 2011/0001186 A1 * | 1/2011 | Seo et al. | 257/330 |
| 2012/0119288 A1 * | 5/2012 | Hozumi et al. | 257/329 |

FOREIGN PATENT DOCUMENTS

| KR | 1020070088055 A | 8/2007 |
|---|---|---|
| WO | WO 97/00536 A1 | 1/1997 |

* cited by examiner

*Primary Examiner* — Dao H Nguyen
*Assistant Examiner* — Tram H Nguyen

(57) ABSTRACT

The present invention relates to a semiconductor device, which includes a junction region formed in an active area of a semiconductor substrate; a trench defining a buried gate predetermined area within the semiconductor substrate; a gate electrode buried in an lower portion of the trench; an ion implantation region formed in a sidewall of the trench; and a capping insulation layer formed in an upper portion of the gate electrode.

7 Claims, 7 Drawing Sheets

SEMICONDUCTOR DEVICE AND METHOD FOR FORMING THE SAME

CROSS-REFERENCES TO RELATED APPLICATIONS

The present application claims priority to Korean patent application number No. 10-2009-0115591, filed on Nov. 27, 2009, which is incorporated by reference in its entirety.

BACKGROUND OF THE INVENTION

The present invention relates to a semiconductor device and a method for forming the same, more particularly, to a semiconductor device which can easily control the overlap of a buried gate and a junction region and a method of manufacture thereof.

Recently, many electronic appliances are equipped with semiconductor devices. The semiconductor device includes electronic elements such as a transistor, a resistor and a capacitor. These electronic elements are integrated on a semiconductor substrate, after being designed to perform a partial function of the electronic products. For instance, electronic products e.g., a computer or a digital camera includes electronic devices such as a memory chip for data storage and a processing chip for the information control, and the memory chip and the processing chip includes electronic elements integrated on the semiconductor substrate.

With the increasing demand for electronic devices, semiconductor devices need to be highly integrated to satisfy the consumer needs for excellent performance and low price. As the integration density of semiconductor memory devices increases, the design rule is reduced and the patterns of the semiconductor device is made more dense. As the fine features and high integration of the semiconductor device are progressed, the chip area is increased proportionally to the the memory capacity, but the cell area in which the patterns of the semiconductor device is formed is reduced. Accordingly, as more patterns have to be formed within a restricted cell area so as to secure a desired memory capacity, a micro-pattern in which the critical dimension of pattern is reduced needs to be formed.

Methods for forming a micro-pattern includes a method of using a phase shift mask as a photo mask, a Contrast Enhancement Layer (CEL) method for forming a separate thin film for improving image contrast on a wafer, a Tri Layer Resister (TLR) method of interposing an intermediate layer such as Spin On Glass (SOG) between photosensitive films of two layers, and a silylation method of selectively doping a silicon in the upper portion of the photosensitive film have been developed to lower the resolution threshold.

In the meantime, since the channel length becomes short as the semiconductor device becomes highly integrated, high concentration doping of the channel is unavoidable so as to secure the characteristics of a transistor. Thus, the deterioration of refresh characteristics needs to be continuously solved. For this, a gate structure or a recess gate structure is transformed into a buried gate structure so that a gate is formed at the lower portion of the bit line. Accordingly, the capacitance between the gate and the bit line and the total capacitance of a bit line can be reduced.

Generally, in the buried gate, an etch back process is performed in a gate metal so that the gate metal of a given thickness remains within a trench. This is done after the semiconductor substrate is deeply etched with a given depth to form the trench and the gate metal is formed on the whole upper portion to fill the trench. Here, the variation of the etch-backed depth exists in the etch back process. Like this, in case the etch-backed depth is not uniform and the thickness of the electrode of the gate is decreased, the gap between the gate electrode and the junction region formed in the active area is widened, so that the channel resistance is increased. Accordingly, there is a problem in that the characteristic of the semiconductor device is deteriorated.

BRIEF SUMMARY OF THE INVENTION

Embodiments of the present invention are directed to solve a problem of deteriorating the characteristic of the semiconductor device as the gap separated between the gate electrode buried in the trench and the junction region is increased due to the change of the extent of etch back, in the etch back process which is accompanied in the buried gate formation.

According to an embodiment of the present invention, a semiconductor device includes a trench defined in an active region of a semiconductor substate, a junction region formed in an active region adjacent to the trench and proximate an upper portion of the trench, a gate electrode defined within an lower portion of the trench, and an ion implantation region formed in a sidewall of the trench.

The ion implantation region is configured to be overlapped with an upper portion of side wall of the gate electrode. The ion implantation region is configured to overlapped with the junction region. The ion implantation region is configured to overlapped with an upper portion of side wall of the gate electrode, and is configured to overlapped with the junction region.

According to an embodiment of the present invention, a method of manufacturing a semiconductor device includes forming a trench defining a buried gate within a semiconductor substrate, filling conductive material within the trench, removing an upper portion of the conductive material to define a gate electrode within a lower portion of the trench, and implanting ions on a sidewall of the trench to define an implantation region.

In accordance with an embodiment of the present invention, before forming a trench, a method of manufacturing a semiconductor device further comprises forming a junction region within the semiconductor substrate.

Implantiong step is performed to be overlapped with an upper portion of side wall of the gate electrode. Implanting step is performed to be overlapped with the junction region. Implanting step is performed to be overlapped with an upper portion of side wall of the gate electrode and the junction region. Implanting step is performed a slant ion implantation process. The slant ion implantation process is performed at an angle of 0.1 degree to 45 degrees. Implanting step is performed a plasma ion implantation process.

According to another embodiment of the present invention, a method of manufacturing a semiconductor device includes forming a trench defining a buried gate within a semiconductor substrate, implanting ions on a sidewall of the trench, filling conductive material within the trench, and removing an upper portion of the conductive material to define a gate electrode within a lower portion of the trench.

In accordance with another embodiment of the present invention, before forming a trench within a semiconductor substrate, a method of manufacturing a semiconductor device further includes forming a junction region within the semiconductor substrate.

Implanting step is performed a slant ion implantation process. The slant ion implantation process has a slant angle of 0.1 degree to 45 degrees. Implanting step is performed a plasma ion implantation process.

The present invention provides an effect that can improve the On current performance of the gate regardless of the increment or decrement of gap separated between the gate electrode and the junction region according to the change of the extent of etch back in the buried gate formation, and can improve the GIDL (Gate induced drain leakage).

DESCRIPTION OF EMBODIMENTS

Hereinafter, the present invention is illustrated in detail with reference to attached drawings according to embodiments of the present invention.

Figure 1:
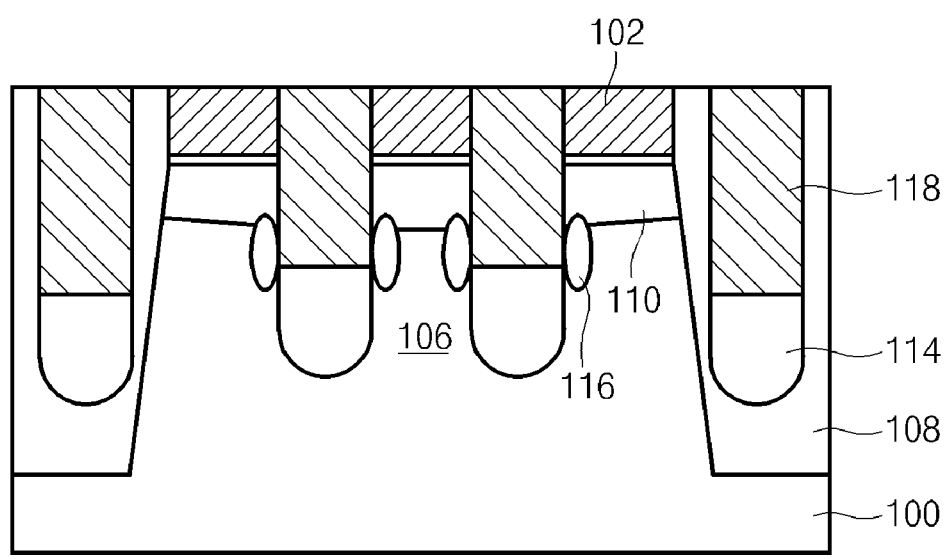
FIG. 1 is a cross-sectional view showing a semiconductor device of the present invention.

FIG. 1 is a cross-sectional view showing a semiconductor device of the present invention. FIGS. 2A to 2F are cross-sectional views showing the formation method of a semiconductor device according to a first embodiment of the present invention. FIGS. 3A to 3F are cross-sectional views showing the formation method of a semiconductor device according to a second embodiment of the present invention.

As shown in FIG. 1, the semiconductor device includes a junction region 110 formed in an active area 106 of a semiconductor substrate 100, a trench (refer to '112' of FIG. 2C) defining a buried gate predeterminded area within the semiconductor substrate 100, a gate electrode 114 buried in the lower portion of the trench, an ion implantation region 116 formed on the sidewall of the trench, and a capping insulation layer 118 formed on the upper portion of the gate electrode 114. In one embodiment, the ion implantation region is defined in a channel provided between the gate electrode 114 and the junction region 110.

As described above, the semiconductor device can prevent the increase of channel resistance by connecting the gate electrode 114 to the junction region 110 of the active area 106 through the ion implantation region 116.

Figure 2A:
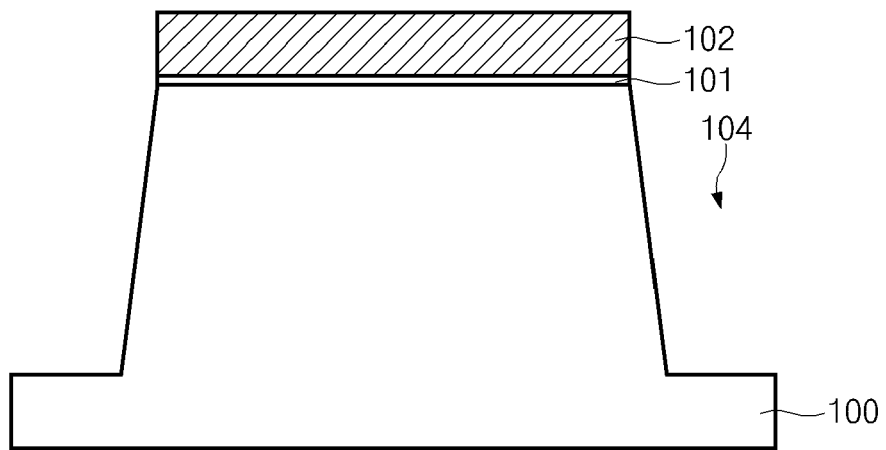
FIGS. 2A to 2F are cross-sectional views showing the formation method of a semiconductor device according to a first embodiment of the present invention.

As shown in FIG. 2a, after forming a pad oxide layer 101 and a pad nitride layer 102 on the upper portion of the semiconductor substrate 100, a photosensitive pattern (not shown) defining a device isolation area on the upper portion of the pad nitride layer 102 is formed. The pad nitride layer 102 and the pad oxide layer 101 are etched with the photosensitive pattern (not shown) as an etching mask, and a predeterminded device isolation area 104 is formed by etching a given thickness of the semiconductor substrate 100.

Figure 2B:
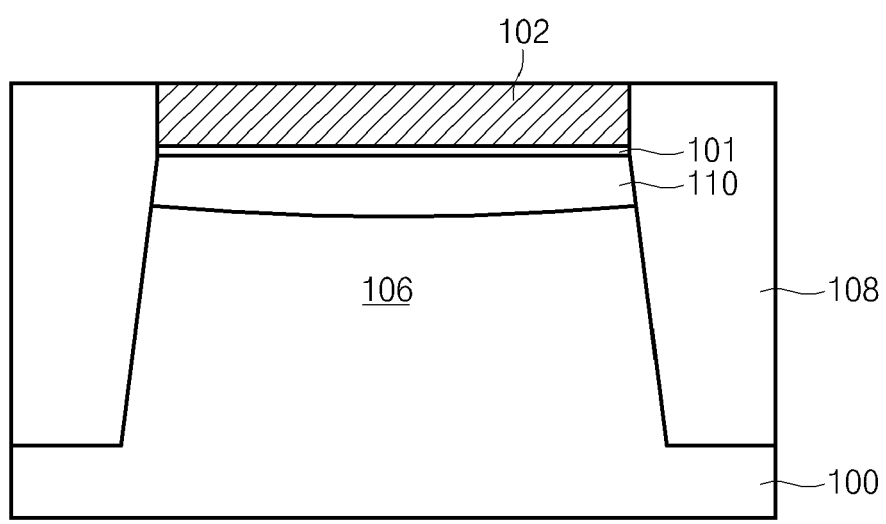

As shown in FIG. 2b, it is preferable that the annealing process is performed on a spin-on dielectric (SOD) film, after the SOD film is formed so that the predeterminded device isolation area 104 may be buried. It is preferable that the planarization etch progress is performed on the SOD film so that the pad nitride layer 102 can be exposed to complete a device isolation area 108. Simultaneously, an active area 106 is defined by the device isolation area 108. It is preferable that the junction region 110 is formed under the pad oxide layer 101 in the active area 106 through an implantion process.

Figure 2C:
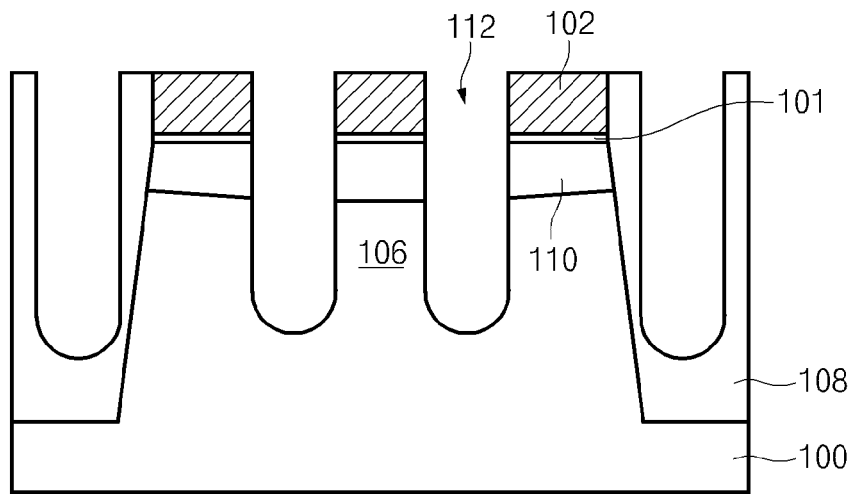

As shown in FIG. 2c, after a photosensitive pattern (not shown) defining the predeterminded buried gate area in the device isolation area 108 and the active area 106 is formed, it is used as an etching mask and the active area 106 and the device isolation area 108 are etched to form a trench 112.

Figure 2D:
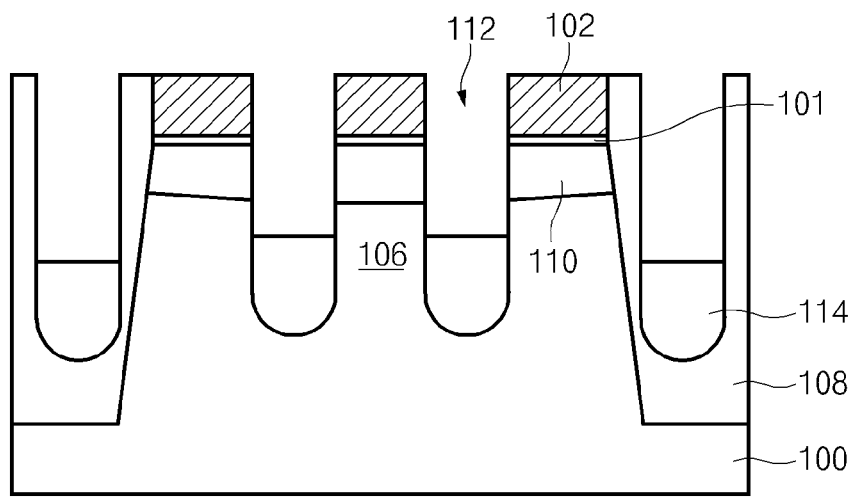

As shown in FIG. 2d, after gate electrode is filled in the trench 112, it is preferable that an etch back process is performed to form a gate electrode 114 recessed in the trench 112.

Figure 2E:
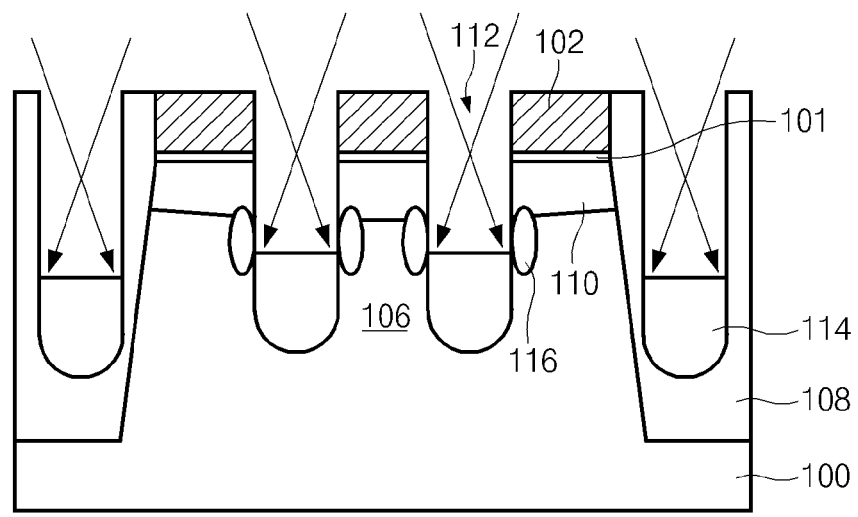

As shown in FIG. 2e, a slant ion implantation process is performed on the sidewall of the trench 112 so that an ion implantation region 116 is formed in the substrate between the gate electrode 114 and the junction region 11'0. However, the process of forming the ion implantation region 116 is not necessarily limited to the slant ion implantation process, but is changeable. For instance, the plasma doping method can be applicable.

It is preferable that the ion implantation region 116 is formed to be overlapped with the gate electrode 114. Alternatively, it is preferable that the ion implantation region 116 is overlapped with the junction region 110 formed in the active area 106. Alternatively, it is preferable that the ion implantation region 116 is overlapped with the gate electrode 114 and with the junction region 110 formed in the active area 106.

Here, it is preferable that the slant ion implantation process has an angle of 0.1 degree to 45 degrees. Moreover, in the case of a NMOS, it is preferable that the implanted ion is a group V-element in the periodic table, e.g., phosphorus P, whereas in the case of a PMOS, it is preferable that the implanted ion is a group-III element, e.g., boron B. Accordingly, even though the thickness of the gate electrode 114 remaining in the trench 110 is decreased as the etch back is excessively performed in the process of forming the gate electrode 114, the gate electrode 114 and the junction region 110 formed in the active area can be securely connected by the ion implantation region 116 so that the increase of channel resistance can be readily prevented.

Figure 2F:
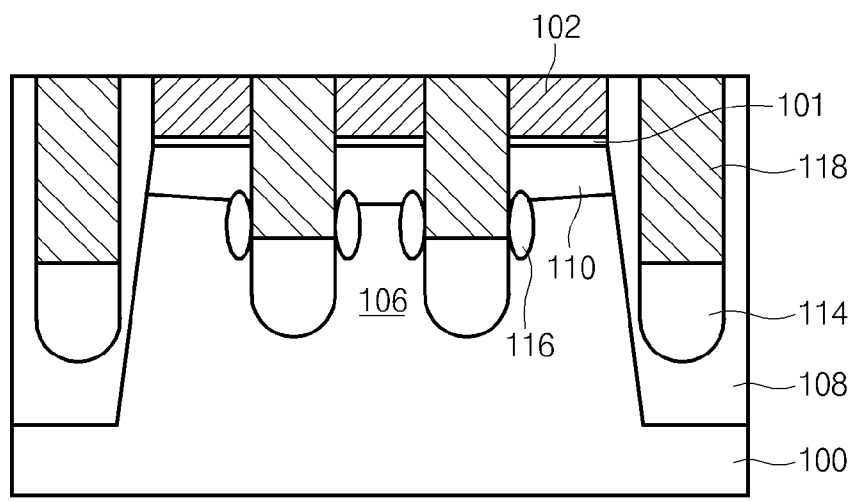

As shown in FIG. 2f, after a capping oxide layer 118 is formed on the upper portion of the gate electrode 114, it is preferable that a planarization etch process is performed until the pad nitride layer 102 and the device isolation area 108 can be exposed to isolate capping oxide layers 118. As described above, the ion implantation region is overlapped with the gate electrode buried within the trench or the junction region which is formed on the active area, or is overlapped with the gate electrode buried within the trench and the junction region so that the increase of the channel resistance can be easily prevented.

Here, in the case that the ion implantation region is formed overlapping with the junction region, or the ion implantation region is formed overlapping with the gate electrode and the junction region, even though a first embodiment of the present invention forms the ion implantation region after forming the gate electrode, the ion implantation region can be formed by another method.

Hereinafter, a method of forming a semiconductor device according to a second embodiment is explained.

Figure 3A:
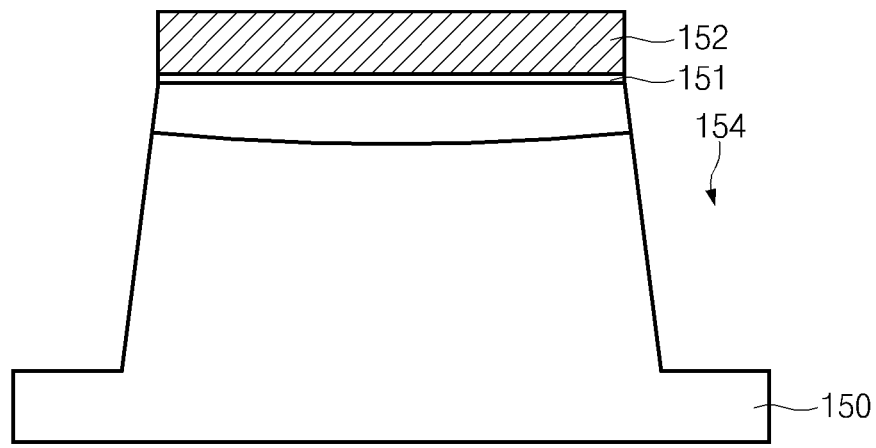
FIGS. 3A to 3F are cross-sectional views showing the formation method of a semiconductor device according to a second embodiment of the present invention.

As shown in FIG. 3a, after a pad oxide layer 151, and a pad nitride layer 152 are formed on the upper portion of a semiconductor substrate 150, a photosensitive pattern (not shown) defining a device isolation area is formed on the upper portion of the pad nitride layer 152. Then, the pad nitride layer 152 and pad oxide layer 151 are etched with a photosensitive pattern (not shown) as an etching mask, and then a given thickness of the semiconductor substrate 150 is etched to form a predeterminded device isolation area 154.

Figure 3B:
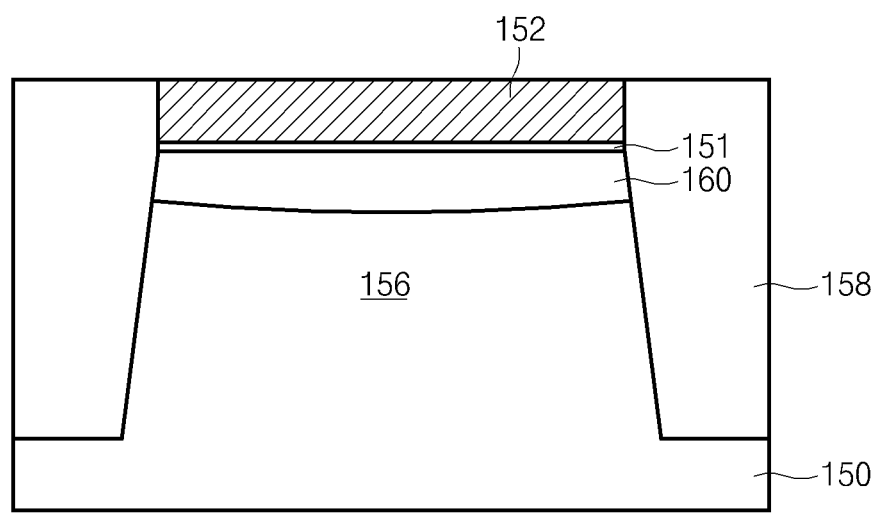

As shown in FIG. 3b, it is preferable that an annealing process is performed on a SOD film, after the SOD film is formed so that the predeterminded device isolation area 154 may be formed. It is preferable that a planarization etch process is performed on the SOD film until the pad nitride layer 152 is exposed and thus a device isolation area 158 is completed. The active area 156 is defined by the device isolation area 158. Then, it is preferable that a junction region 160 is formed under the pad oxide layer 151 in the active area 156 by an implant process.

Figure 3C:
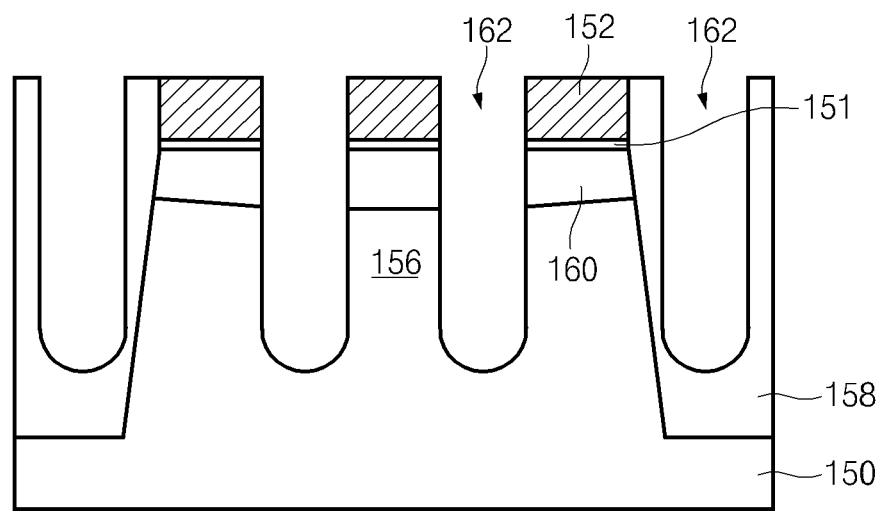

As shown in FIG. 3c, after a photosensitive pattern (not shown) defining a gate area in the device isolation area 158 and the active area 156 is formed, it is used as an etching mask and the active area 156 and the device isolation area 158 are etched to form a trench 162.

Figure 3D:
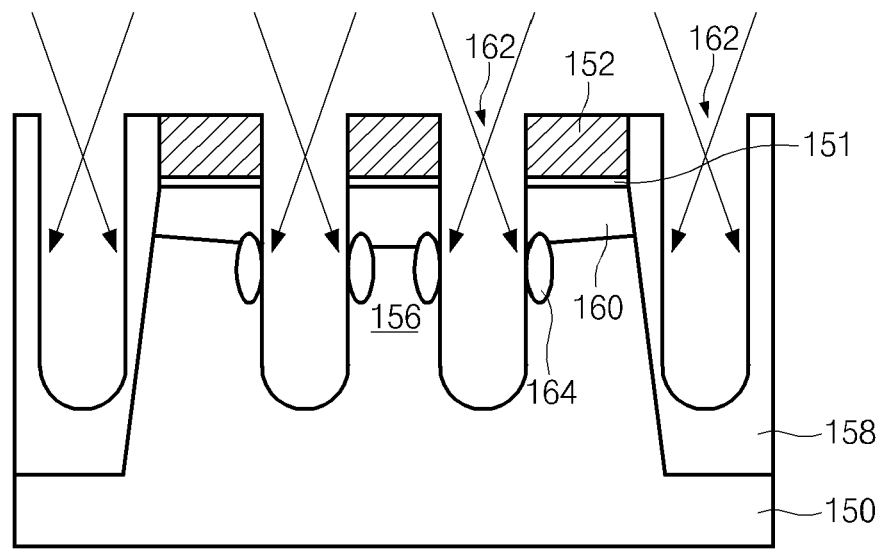

As shown in FIG. 3d, a slant ion implantation process is performed on the side wall of the trench 162 to form an ion implantation region 164 under the side wall of the trench 162. However, a plasma doping method can be applicable instead of the slant ion implantation process. Here, it is preferable that the slant ion implantation process is performed at an angle of 0.1 degree to 45 degrees. Moreover, in the case of a NMOS, it is preferable that the implanted ion is a group-V element in a periodic table, e.g., phosphorus P, whereas, in the case of a PMOS, it is preferable that the implanted ion is a group-III element, e.g., boron B.

Accordingly, although a distance between the gate electrode 166 and the junction region 160 is increased as a result that an etch back is excessively performed in the process of forming a gate electrode 166 and a thickness of the gate electrode 166 is decreased, the gate and the junction region 160 can be electrically connected.

When a thickness of the junction region 160 becomes small and thus a distance between the gate electrode 166 and the junction region 160 is increased, gate induced drain leakage (GIDL) occurs. However, according to the present invention, even though either the gate electrode 166 or the junction region 160 is formed thin, reliable electrical coupling therebetween can be ensured by the ion implantation region 164.

Figure 3E:
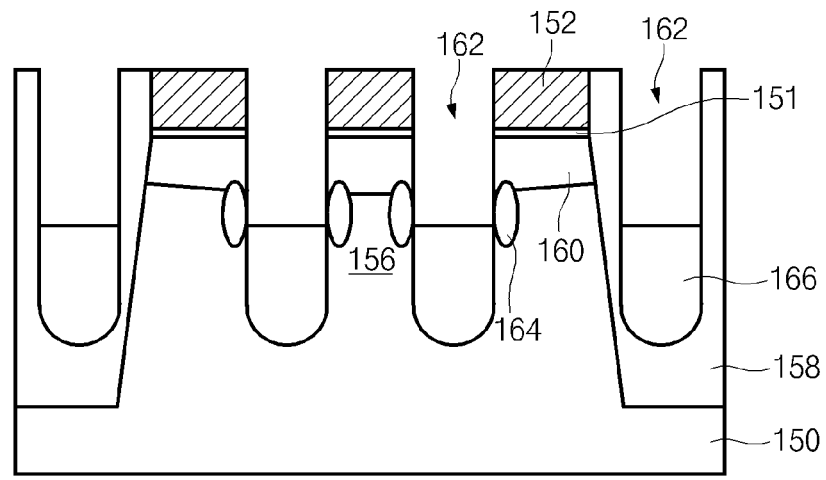

As shown in FIG. 3e, after the gate electrode is formed on the whole upper portion including the trench 162, it is preferable that the gate electrode 166 is formed by performing an etch back process so that the gate electrode of a given thickness remains. Here the gate electrode 166 can be easily connected to the junction region 160 by the ion implantation region. 164 formed in the previous process.

Figure 3F:
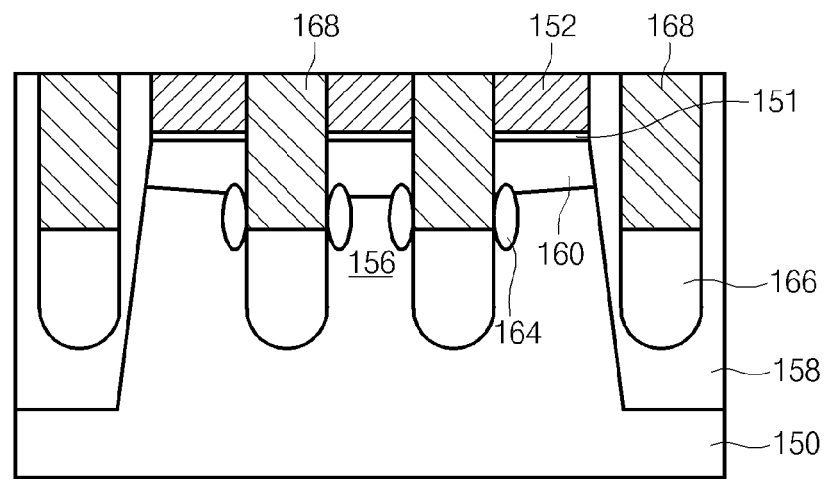

As shown in FIG. 3f, after a capping oxide 168 is formed on the upper portion of the gate electrode 166, it is preferable that the planarization etch process is performed so that the pad nitride layer 152 and the device isolation area 158 be exposed and the trench is completely filled in.

As shown above, the present invention forms an ion implantation region under the sidewall of the trench formed in order to form a buried gate so that it can prevent an increase of the channel resistance regardless of the thickness variation of a gate electrode due to an over-etch in an etch back process onto the gate electrode, and can thus improve the characteristic of the semiconductor device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a semiconductor device, the method comprising:
   forming a junction region in an upper portion of a semiconductor substrate through an implantation process, wherein the junction region is configured to have a first polarity;
   forming a trench defining a buried gate by etching the junction region and the substrate under the junction region;
   forming a gate electrode within a lower portion of the trench; and
   implanting ions at a sidewall of the trench to form an implantation region between the junction region and the gate electrode, wherein the implantation region is configured to have the first polarity.

2. The method of claim 1, wherein the implantation region is overlapped with an upper portion of the gate electrode.

3. The method of claim 1, wherein the implantation region is overlapped with the junction region.

4. The method of claim 1, wherein the implantation region is overlapped with an upper portion of the gate electrode and the junction region.

5. The method of claim 1, wherein the implanting step is performed by a slant ion implantation process.

6. The method of claim 5, wherein the slant ion implantation process is performed at an angle of 0.1 degree to 45 degrees.

7. The method of claim 1, wherein the implanting step is performed by a plasma ion implantation process.

* * * * *